United States Patent
Choi et al.

(10) Patent No.: US 6,186,779 B1
(45) Date of Patent: Feb. 13, 2001

(54) WAFER CLAMP FOR A HEATER ASSEMBLY

(75) Inventors: Hae-Moon Choi; Sung-Tae Kim; Hyun-Kuk Ko; Dae-Moon Kim, all of Kyunggi-do (KR)

(73) Assignee: Samsung Electronics Co., Ltd. (KR)

( * ) Notice: Under 35 U.S.C. 154(b), the term of this patent shall be extended for 0 days.

(21) Appl. No.: 09/334,133

(22) Filed: Jun. 15, 1999

(30) Foreign Application Priority Data

Jun. 20, 1998 (KR) .................................. 98-23274

(51) Int. Cl.[7] ...................................................... F27D 5/00
(52) U.S. Cl. .......................... 432/258; 432/253; 432/259; 269/21; 204/298.15
(58) Field of Search ...................... 432/241, 249, 432/253, 258, 259; 438/978, 973; 211/41.18; 269/21, 287; 29/25.01; 204/298.15

(56) References Cited

U.S. PATENT DOCUMENTS

| | | | |
|---|---|---|---|
| 4,537,244 | * | 8/1985 | Holden ................................. 118/728 |
| 5,131,460 | * | 7/1992 | Krueger ............................... 165/80.2 |
| 5,421,401 | * | 6/1995 | Sherstinsky et al. ............. 118/728.1 |
| 5,605,866 | * | 2/1997 | McClanahan et al. .............. 118/728 |
| 5,725,718 | * | 3/1998 | Banholzer et al. .................. 118/728 |
| 5,842,690 | * | 12/1998 | Lee et al. ................................ 269/21 |
| 5,885,428 | * | 3/1999 | Kogan ................................... 118/728 |
| 5,969,934 | * | 10/1999 | Larsen ................................... 361/234 |

* cited by examiner

*Primary Examiner*—Denise L. Ferensic
*Assistant Examiner*—Gregory A. Wilson
(74) *Attorney, Agent, or Firm*—Skjerven Morril MacPherson LLP; David T. Millers

(57) ABSTRACT

A clamp holds a semiconductor wafer during an Al reflow process. The clamp is made of a ceramic material, and thereby clamp surface roughening which damages semiconductor wafers and other damaging of the wafer caused by the deformation of the clamp are avoided. A sloped surface of the clamp pad can also reduce the damage on the wafer by reducing the contact area between the clamp pad and the wafer. In addition, the clamp has several features that can reduce heat dissipation from the wafer to outside during the Al reflow. Slots formed on the pad reduce the amount of heat conduction through the clamp, and the polished inner surface of the clamp cap reflects the heat radiated from the wafer back to the wafer.

16 Claims, 4 Drawing Sheets

WAFER CLAMP FOR A HEATER ASSEMBLY

FIELD OF THE INVENTION

The present invention relates to an apparatus for semiconductor fabrication, and more particularly to a heater assembly clamp used in an Al reflow process.

BACKGROUND OF THE INVENTION

In manufacturing a semiconductor device, an Al (aluminium) reflow process provides metal with excellent step coverage for filling high aspect ratio contact openings. In performing Al reflow on a semiconductor wafer, argon (Ar) gas can be blown on the back side of the wafer to improve temperature uniformity and thermal conductivity. However, the argon gas flow can separate the wafer from a heater table on which the wafer sits for the Al reflow by creating a pressure difference between a high vacuum chamber and the backside of the wafer. Thus, a clamp is used for preventing the wafer separation.

FIG. 6 illustrates a known clamp 100, which holds a semiconductor wafer during Al reflow. Clamp 100 includes a cap 102, a pad 104 and a mounting plate 106 which are made of stainless steel. Cap 102 and pad 104 are fixed to mounting plate 106 by screws 110. Clamp 100 can damage a semiconductor wafer that is fixed between pad 104 and mounting plate 106. For example, a wafer edge section that contacts the pad 104 may crack when heating causes clamp 100 and the wafer to expand. Although slots 108 are made in clamp 100 to suppress expansion of pad 104 that may contact and damage the wafer, the expansion can still damage the wafer during an actual process. Additionally, the surface of pad 104 can become rough, due to deformation of pad 104 during multiple high temperature processes. As a result, the rough surface of pad 104 can damage a surface of the wafer.

SUMMARY OF THE INVENTION

According to an embodiment of the present invention, a heater assembly clamp includes a pad, a cap and a mounting plate which are made of a ceramic material. The pad contacts the edge of a semiconductor wafer, and the cap covers the top surface of the wafer. The mounting plate covers the side surface of the wafer. The cap, the pad and the mounting plate may be integrated in a single body or structure.

The clamp can include several additional features to improve performances. The inner surface of the cap and the pad can be polished to enhance thermal reflectivity. The surface of the pad contacting the wafer can be sloped 0.5 degree or more with respect to a horizontal plane to minimize potentially damaging contact with a wafer, and the pad can have slots outside the perimeter of the wafer to reduce heat dissipation from the wafer through the clamp.

Since the clamp is made of a ceramic material, which has less thermal deformation than stainless steels, the damage to the wafer due to the deformation of a clamp pad is reduced. In addition, the ceramic material has lower thermal conductivity than the stainless steel, and thus the heat dissipation from the wafer through the clamp is reduced. The reduction of the heat dissipation minimizes the temperature difference across the wafer during the Al reflow.

BRIEF DESCRIPTION OF THE DRAWINGS

The present invention will be more clearly understood from the description set forth below, with reference to the accompanying drawings, wherein.

Use of the same reference symbols in different figures indicates similar or identical items.

DETAILED DESCRIPTION OF PREFERRED EMBODIMENTS

Figure 1:
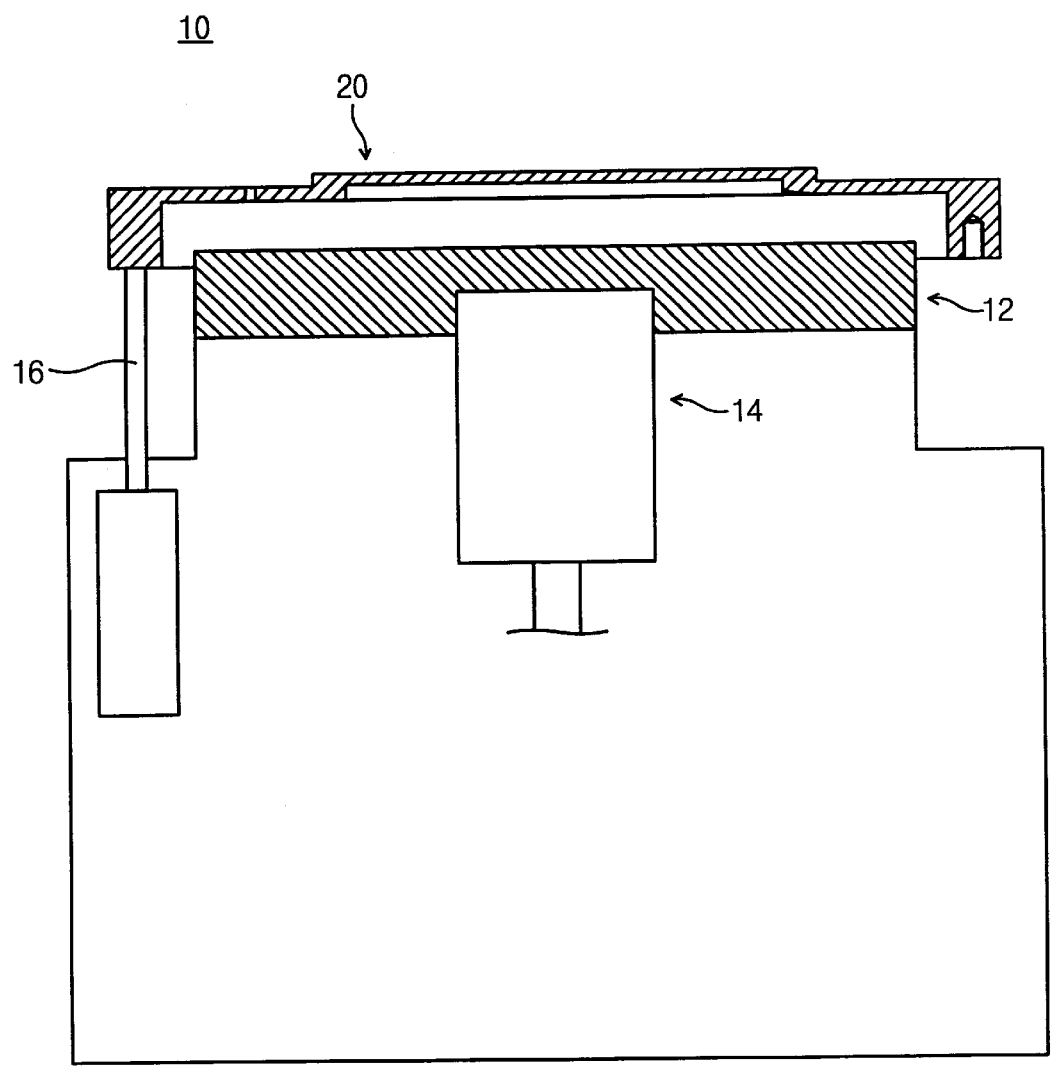
FIG. 1 is a block diagram of a heater assembly according to an embodiment of the present invention.

Referring to FIG. 1, in accordance with an embodiment of the present invention, a heater assembly 10 is suitable for an Al reflow which a heating process capable of filling a high aspect ratio contact opening in a semiconductor device having an Al (aluminium) layer deposited thereon. Heater assembly 10 includes a heater block 12, a clamp 20 and a lifter 14. Lifter 14 loads and unloads a semiconductor wafer on and from heater block 12. Heater block 12 includes heating elements (not shown) that heat the wafer to an elevated temperature. Multiple holes (not shown) in heater block 12 are for a flow of an inert gas such as Ar gas to a backside of the wafer. Heater assembly 10 further includes a shaft 16 for moving clamp 20 up and down. Before the wafer is loaded on heater block 12, clamp 20 moves up to permit loading. After the wafer is loaded on heater block 12, clamp 20 descends to hold the wafer. Then, heater block 12 heats to an elevated temperature for reflowing the deposited Al layer, and Ar gas flows to the backside of the wafer during the Al reflow.

Figure 2:
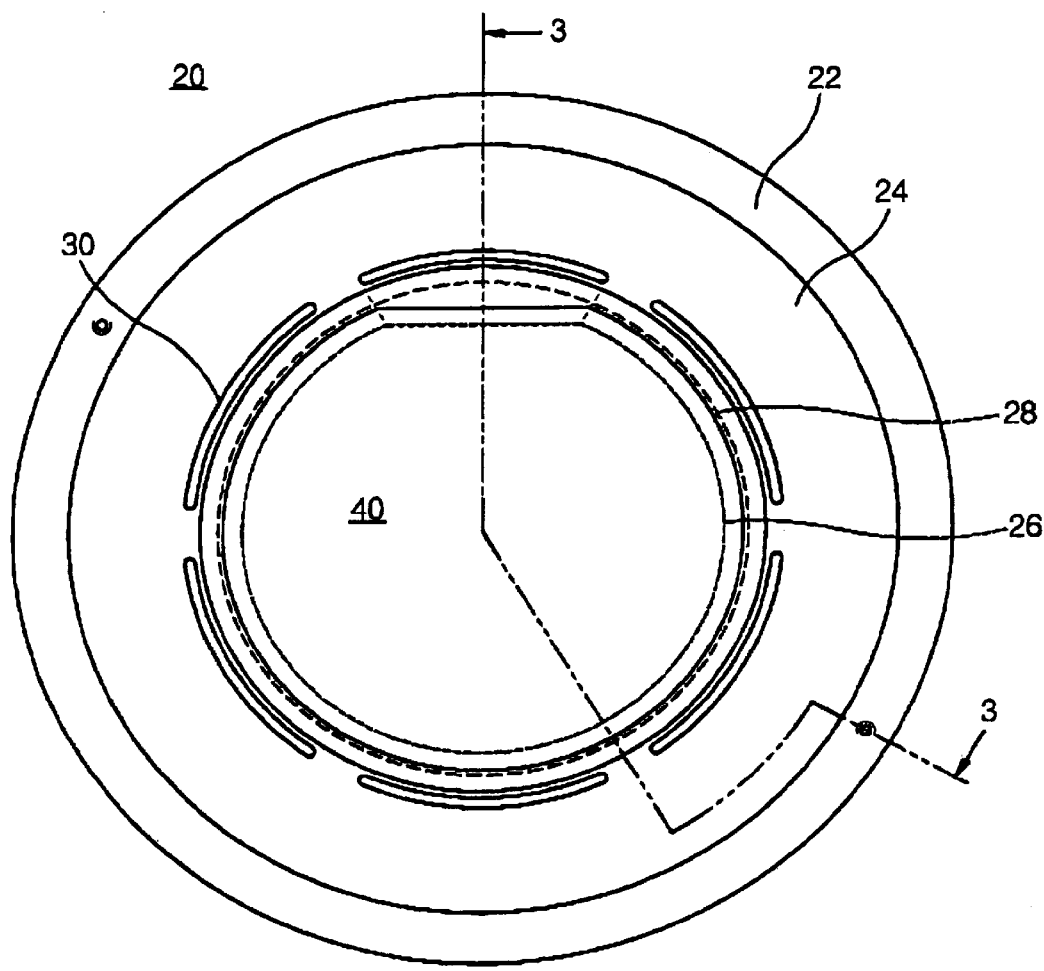
FIG. 2 is a bottom view of a clamp according to an embodiment of the present invention.
Figure 3:
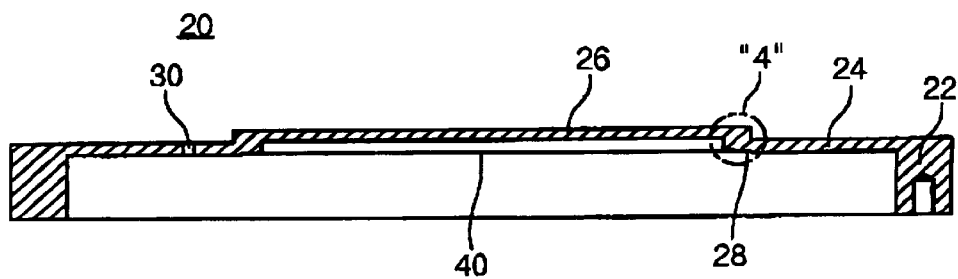
FIG. 3 is a sectional view taken along a line 3—3 of FIG. 2.

FIGS. 2 to 5 illustrate an embodiment of clamp 20. The dotted circle in FIG. 2 indicates a perimeter of cap 26 of FIG. 1. Referring to FIGS. 2 and 3, clamp 20 includes a mounting plate 22, a pad 24, and a cap 26 which are made of a ceramic material such as alumina. Ceramic materials have several advantages as a material for clamp 20. In particular, since ceramics do not deform when subjected to repeated heating cycles, the clamp surface roughening which occurs in a metal clamp does not occur in a ceramic clamp. Further, the low thermal conductivity of ceramics can reduce heat dissipation from a semiconductor wafer 40 through clamp 20 to the outside. Although, in FIGS. 2 and 3, mounting plate 22, pad 24 and cap 26 are integrated into a single body, mounting plate 22, pad 24 and cap 26 can be separate from one another.

Figure 4:
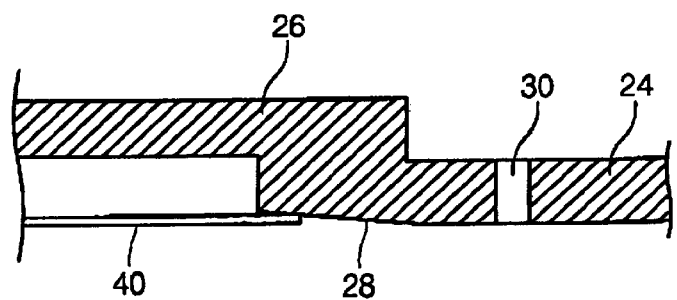
FIG. 4 is an enlarged view of a portion "4" of FIG. 3.
Figure 5:
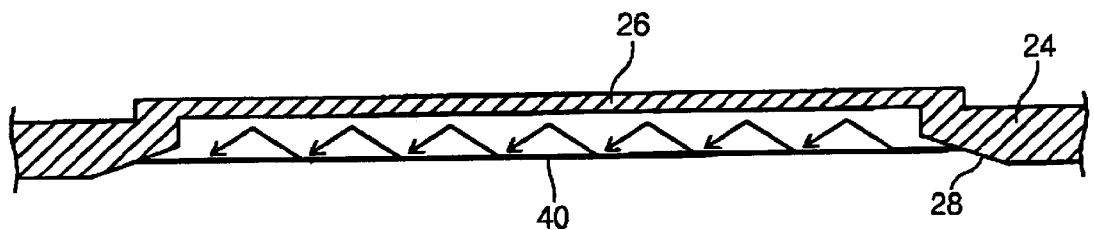
FIG. 5 is a sectional view of a clamp illustrating heat conservation capability of the clamp according to an embodiment of the present invention.
Figure 6:
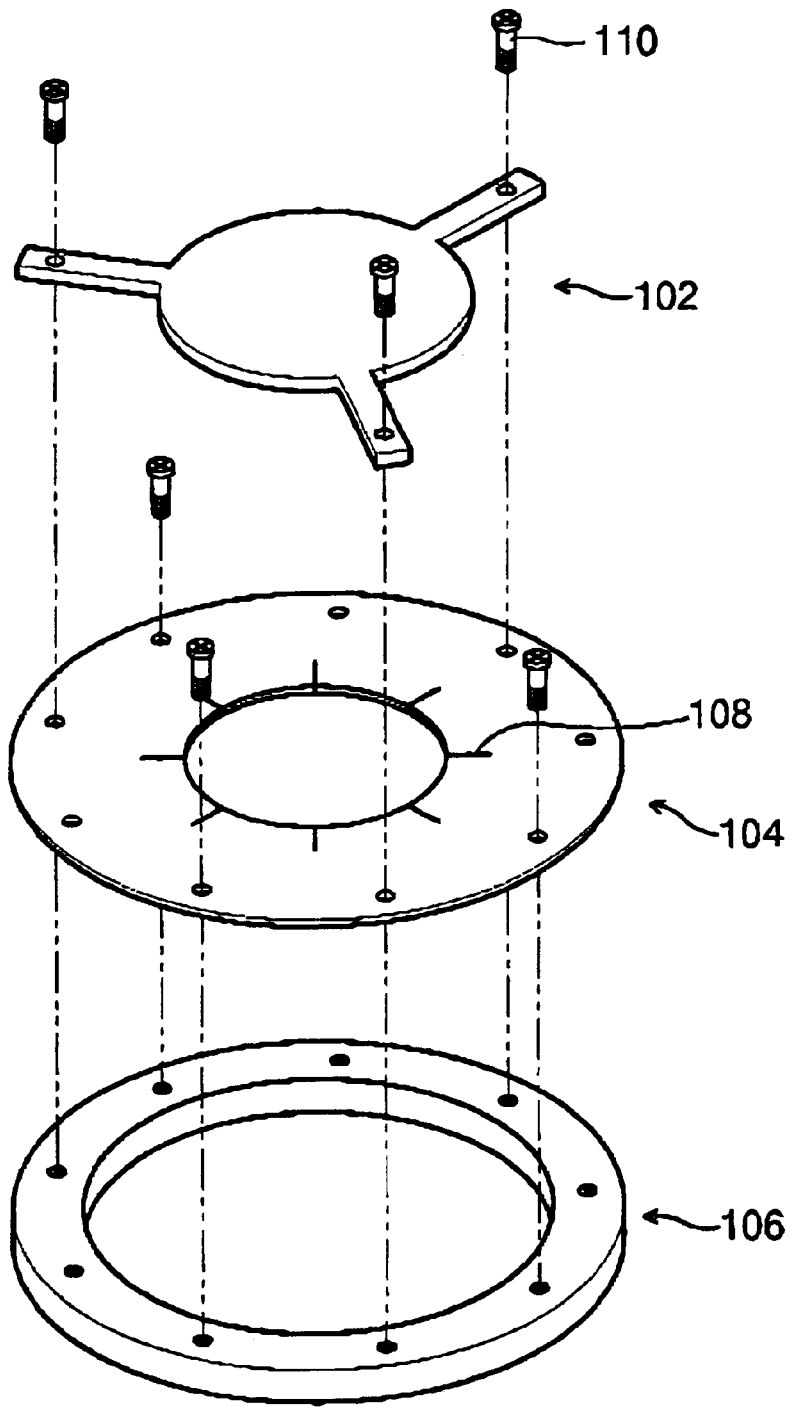
FIG. 6 is an exploded perspective view of a conventional clamp.

Pad 24 of clamp 20 contacts semiconductor wafer 40 as shown in FIGS. 4 and 5. A contact surface 28 of pad 24 contacts and holds an edge of wafer 40, so that wafer 40 remains on heater block 12 (FIG. 1) when Ar gas is blown to the backside of wafer 40. Referring to FIG. 4, contact surface 28 is sloped at 0.5 degrees or more, preferably 2 degrees, with respect to a horizontal surface of pad 24 and wafer 40, which is adjacent to contact surface 28. Sloped contact surface 28 minimizes the contact area between wafer 40 and contact surface 28, and thereby can reduce damage on wafer 40.

Pad 24 has slots 30 formed along the outside of contact surface 28. Slots 30 can have various shapes and sizes. Slots 30 reduce the amount of heat dissipated from wafer 40 through pad 24 to outside by reducing the cross-sectional area of pad 24, through which heat flows. Slots 30 are formed outside contact surface 28 of cap 26 along the perimeter of cap 26. The thickness of pad 24 controls the conduction and radiation of heat to the outside. Pad 24 should be thin to reduce heat flow, but the thickness of pad 24 also must be set according to the ceramic material strength. With currently available ceramics, the thickness of the pad 24 is generally less than 5 mm, and preferably less than about 1.6 mm.

Referring to FIG. 5, an inner surface of cap 26 faces the top surface of wafer 40. The heat radiated from wafer 40 can dissipate through cap 26. Thus, in order to reduce the heat radiation from wafer 40, the inner surface of cap 26 is polished to reflect the heat radiated from wafer 40 back to wafer 40. The arrows of FIG. 5 illustrate the heat reflection by cap 26. Mounting plate 22 covers the side surface of wafer 40 and, as mentioned above, is coupled to shaft 16 of heater assembly 10 (FIG. 1).

Since, in accordance with the invention, the clamp is made of a ceramic material, the clamp surface roughening which causes a damage on a semiconductor wafer is avoided. Other damage on the wafer caused by the deformation of the clamp are also avoided. Further, a sloped surface of the clamp pad can reduce the damage on the wafer by reducing the contact area between the clamp pad and the wafer.

In addition, the clamp has several features that can reduce heat dissipation from the wafer to outside during the Al reflow. The slots formed on the pad reduce the amount of heat conduction through the clamp, and the polished inner surface of the clamp cap reflects the heat radiated from the wafer back to the wafer.

Although the invention has been described with reference to particular embodiments, the description is only an example of the inventor's application and should not be taken as a limitation. Various adaptations and combinations of features of the embodiments disclosed are within the scope of the invention as defined by the following claims.

What is claimed is:

1. A clamp for holding a semiconductor wafer, comprising:
    a cap entirely covering and enclosing a top surface of the semiconductor wafer;
    a pad attached to and located around the cap and contacting an edge of the semiconductor wafer, the pad including a plurality of slots formed on the pad and around the cap; and
    a mounting plate supporting the pad.
2. The clamp of claim 1, wherein the pad, the cap and the mounting plate are made of a ceramic material.
3. The clamp of claim 1, wherein the cap, the pad and the mounting plate are integrated into a single body.
4. The clamp of claim 1, wherein an inner surface of the cap that faces the semiconductor wafer is polished to reflect heat radiated from the semiconductor wafer, back to the semiconductor wafer.
5. The clamp of claim 1, wherein a surface of the pad has a slope relative to the semiconductor wafer where the pad contacts the semiconductor wafer.
6. The clamp of claim 5, wherein the slope is 0.5 degree or more.
7. The clamp of claim 1, wherein the clamp moves up to allow loading of the semiconductor wafer on a heater block and moves down to hold the wafer against the heater block.
8. The clamp of claim 7, wherein the clamp holds the semiconductor wafer on the heater block for a reflow process.
9. A clamp for holding a semiconductor wafer, comprising a cap entirely covering and enclosing a top surface of the semiconductor wafer, wherein an inner surface of the cap that faces the top surface of the semiconductor wafer is polished to reflect heat radiated from the semiconductor wafer, back to the semiconductor wafer.
10. The clamp of claim 9, wherein the clamp applies pressure to the semiconductor wafer to hold a back side of the semiconductor wafer in contact with a heater block.
11. A heater assembly comprising:
    a heater block; and
    a clamp that holds a semiconductor wafer on the heater block, the clamp comprising:
        a cap entirely covering and enclosing a top surface of the semiconductor wafer;
        a pad attached to and located around the cap and contacting an edge of the semiconductor wafer, the pad including a plurality of slots formed on the pad and around the cap; and
        a mounting plate supporting the pad, wherein
    the clamp moves up to allow loading of the semiconductor wafer on the heater block and moves down to hold the wafer against the heater block.
12. The heater assembly of claim 11, wherein the pad, the cap and the mounting plate are made of a ceramic material.
13. The heater assembly of claim 11, wherein the cap, the pad and the mounting plate are integrated into a single body.
14. The heater assembly of claim 11, wherein an inner surface of the cap that faces the semiconductor wafer is polished to reflect heat radiated from the semiconductor wafer.
15. The heater assembly of claim 11, wherein a surface of the pad has a slope relative to the semiconductor wafer where the pad contacts the semiconductor wafer.
16. The heater assembly of claim 15, wherein the slope is 0.5 degree or more.

* * * * *